United States Patent
Hayden et al.

(10) Patent No.: US 6,469,372 B2
(45) Date of Patent: Oct. 22, 2002

(54) MATCHED THERMAL EXPANSION CARRIER TAPE ASSEMBLAGE FOR SEMICONDUCTOR DEVICES

(75) Inventors: Michael L. Hayden, Plano, TX (US); Clessie A. Troxtell, Jr., Howe, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/852,529

(22) Filed: May 10, 2001

(65) Prior Publication Data

US 2001/0042909 A1 Nov. 22, 2001

Related U.S. Application Data

(60) Provisional application No. 60/204,497, filed on May 16, 2000.

(51) Int. Cl.⁷ .............................................. H01L 23/02
(52) U.S. Cl. ..................... 257/679; 257/673; 438/112
(58) Field of Search ..................... 257/679; 242/71.8; 206/714; 438/112; 428/40.1, 357, 194, 200, 424.2

(56) References Cited

U.S. PATENT DOCUMENTS

| | | | | |
|---|---|---|---|---|
| 4,880,180 A | * | 11/1989 | Adair | 242/71.8 |
| 5,415,906 A | * | 5/1995 | Miyakawa et al. | 428/357 |
| 5,691,038 A | * | 11/1997 | Hirata et al. | 428/194 |
| 5,769,237 A | * | 6/1998 | Althouse et al. | 206/714 |
| 5,985,695 A | * | 11/1999 | Freyman et al. | 438/112 |
| 6,030,692 A | * | 2/2000 | Auger | 428/200 |
| 6,171,672 B1 | * | 1/2001 | Koike et al. | 428/40.1 |
| 6,206,198 B1 | * | 3/2001 | Troxtell et al. | 206/714 |
| 6,218,017 B1 | * | 4/2001 | Yamashita et al. | 428/424.2 |

FOREIGN PATENT DOCUMENTS

JP 408244839 A * 9/1996 .......... B65D/73/02

* cited by examiner

Primary Examiner—David Nelms
Assistant Examiner—Thinh T. Nguyen
(74) Attorney, Agent, or Firm—Godwin Gruber, P.C.; Gary C. Honeycutt

(57) ABSTRACT

A carrier and cover tape assemblage for semiconductor devices which maintains integrity through bake temperature of 125 degrees C is provided by cover and carrier tapes of the same material, such as polycarbonate, and thus having the same thermal properties so that the joining adhesive is placed under minimal stress to cause delamination or distortion.

11 Claims, 2 Drawing Sheets

MATCHED THERMAL EXPANSION CARRIER TAPE ASSEMBLAGE FOR SEMICONDUCTOR DEVICES

This application claims the benefit of Provisional application Ser. No. 60/204,497, filed May 16, 2000.

FIELD OF THE INVENTION

The present invention relates generally to a shipping container for semiconductor devices and more specifically a bakeable tape carrier for such devices.

BRIEF DESCRIPTION OF RELATED ART

Integrated circuit devices require a means for protective handling and transporting of the finished parts in order to avoid mechanical damage to the lead tips, the lead finishes, or assembled packages, as well as to provide environmental protection from moisture and from static charges. Further, the integrated circuit (IC) devices must be transported in carriers that are compatible with the customer's in-house equipment system. For these reasons, the dimensions and design of primary carriers for integrated circuit devices have received considerable attention from worldwide committees, and have been standardized so that the using customer is not subjected to variations from different suppliers. Leaded surface mount devices, as well as more advanced area array packaged devices are transported in tape carriers on reels, while some devices are stored and transported in plastic trays with an array of recesses.

In addition to storing and transporting semiconductor devices in carriers, it is often desirable to "dry bake" the devices in the same carriers in order to minimize handling. Plastic molded surface mount integrated circuit devices are subject to delamination of the encapsulating plastic mold compound from the leadframe or substrate during solder attachment to a printed wiring board. In extreme cases the package cracks, which may in turn result in opens, or other reliability failures during use, or in testing. The failure mechanism has been traced to absorption of moisture by the molding compound, which vaporizes when the device is subjected to rapid heating during solder reflow processing, and the resulting vapor exerts pressure at the plastic to metal interface. This problem has intensified as packages have become larger and thinner.

In order to avoid such failure, devices which are subject to the problem must be "dry baked" at a temperature high enough, and for sufficient length of time to drive the moisture out of the package. The devices undergo dry baking after they have completed assembly processing and testing, and again after the containers have been opened, if they have not been used within the allowable time.

Dry bake specifications require a time and temperature combination which will assure desorbtion of moisture prior to surface mount assembly. It is preferable to bake at the maximum temperature of 125 degrees C for shorter time, rather than an alternate dry bake processes with low temperatures such as 55 degrees C which require as much as 68 days to accomplish the objective. There are a number of obvious objections to the longer time including requiring more bake equipment, space, and utilities, as well as the cycle time increase. Standards committees, such as EIA (Electronic Industries Association) and JEDEC (Joint Electronic Devices Engineering Council) have set specific standards related to this issue based on integrated circuit packages type, standards for testing procedures, and also standards for packing containers used for the shipping and storage.

Tape carriers on reels provide a compact means for storing, transporting, and dispensing integrated circuits. The reel is placed directly onto a relatively small piece of equipment for picking and placing the circuits, and as a result this type of handling equipment has become more desirable to the end user than the more bulky x/y table used to pick and place from trays.

FIG. 1 illustrates a tape and reel carrier in which integrated circuit packaged devices 101 are held in a series of in-line recesses 102 in a carrier tape 103. The upper surface of the carrier tape is sealed by a cover tape 104 to hold the devices in place, and avoid contamination. Width of the tape is governed by size of IC packages. The tape is wound onto a reel 105. The reel diameter is kept constant for compatibility with equipment at both the user and supplier.

Unfortunately, while the details of carrier and tape design have been well defined by the industry, little attention has been placed on the thermal characteristics of the materials which would which maintain integrity of the carrier and cover tapes at maximum dry bake temperature of 125 degrees C.

A commonly used carrier tape is a formed polycarbonate polymer, and a typical cover tape material is a polyester polymer. The materials are not mutually compatible for high temperature applications, and in fact distortion of the cover tape occurs with resulting delamination from the carrier when the exposed to high temperature bake at 125 degrees C. Heat deflection temperature for PET polyesters is about 41 degrees C, and that of polycarbonate is about 140 degrees C, thus resulting in poor service of the polyester cover film for dry bake.

Existing adhesive technologies include pressure sensitive and heat sensitive compounds. The adhesive must hold cover tape in place without any delamination, but must release at a consistent strength throughout the tape length, and that pull force must be 130 grams force. Adhesive strength of heat sensitive adhesives typically increases by additional cross linking upon exposure to extended time/temperature excursions, thus making them unsuitable for dry bake processing.

A strong need exists in the industry for a robust, system of carrier and cover tape which is compatible with existing automation, and maintains integrity, during dry bake, and/or multiple heating and cooling cycles encountered during transportation, storage and uses of the integrated circuit devices prior to assembly on a printed circuit board.

SUMMARY

It is an object of this invention to provide a carrier and cover tape assemblage for integrated circuit devices which will maintain integrity at exposure to temperature as high as 125 degrees Centigrade.

It is further an object of the invention that the carrier tape and cover tape assemblage be a simple replacement for the existing technology, requiring no change in processing equipment to the user.

It is also an object of the invention that the cover tape be transparent, so that the circuit devices are readily viewed.

It is an object of the invention to provide a carrier and cover tape combination which will release consistently upon demand at less than 130 grams peel force, after 125 degrees C dry bake for as much as 24 hours.

Another object of the current invention is to provide a carrier sufficiently robust to protect the IC devices from damage due to mechanical shock normally encountered during shipping.

Another object of the current invention is to provide a carrier system which has no appreciable change in weight and volume from existing carriers.

Yet another object of the invention is that it be sufficiently flexible to be assembled onto a reel.

The objectives of the current invention are met by providing a cover tape having the same thermal properties as that of the carrier tape itself. By employing the same material, and thus like thermal properties for both carrier and tape, the joining adhesive is placed under minimal stress to cause delamination, and subsequent exposure of the IC devices to the ambient.

The assemblage of the current invention includes a thin film polycarbonate cover tape with pressure sensitive adhesive laminated to a polycarbonate carrier. Polycarbonate polymer has a heat deflection temperature of about 135 degrees C, or a temperature well above that of the maximum dry bake temperature, and has been shown to be suitable for fabrication of carrier tapes and reels. In order to meet the objective of transparency, it is necessary that the cover tape be very thin, and be supplied without added colorant.

A pressure sensitive adhesive, known in the industry maintains consistent peel strength after prolonged thermal exposure at 125 degrees C. The peel force is less than 130 grams force, and thus is consistent with requirements of industry standards.

Other objects and advantages of the present invention will become apparent from the following descriptions, taken in connection with the accompanying drawings. The drawings constitute a part of this specification and include an exemplary embodiment of the invention, which may be embodied in various forms.

DETAILED DESCRIPTION OF THE INVENTION

Figure 1:
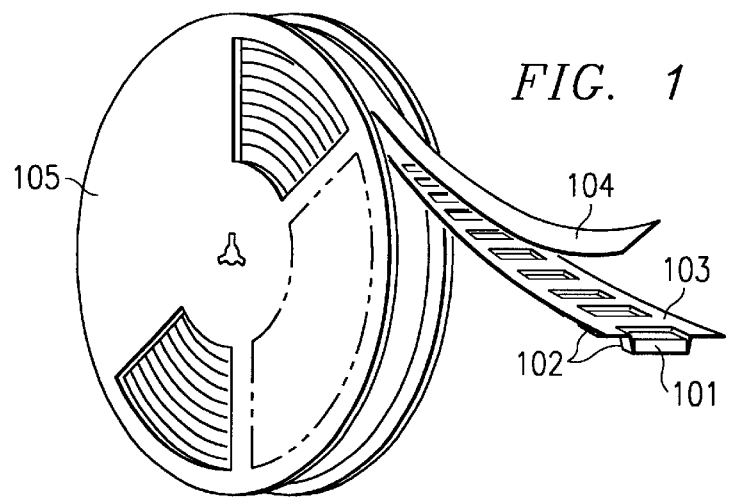
FIG. 1 illustrates tape and reel carrier format for integrated circuits. (Prior art)
Figure 2A:
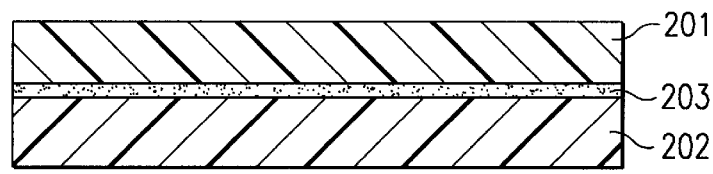
FIG. 2 illustrates the effect of thermal expansion mismatch between two materials laminated together.
Figure 2B:
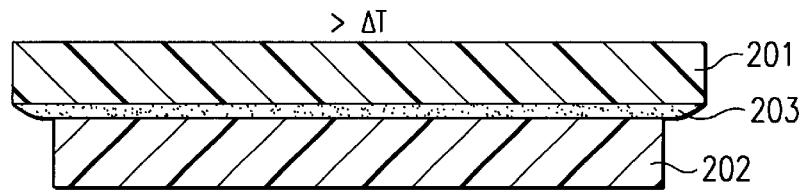
Figure 2C:
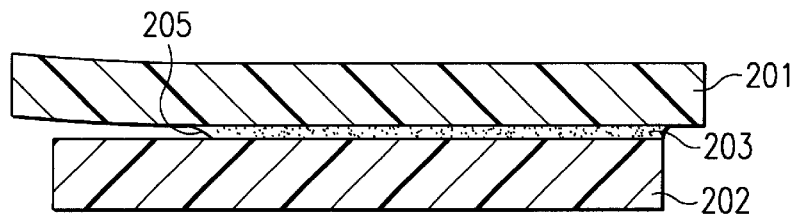
Figure 2D:
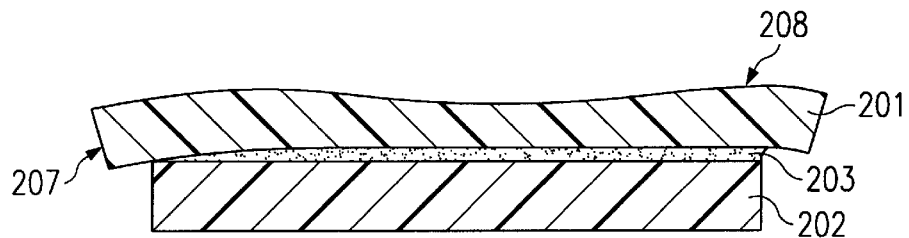

In order to understand the rationale behind the current invention, FIG. 2 illustrates the effect of a thermal excursion on two materials having different thermal expansion characteristics joined at an interface. In FIG. 2a, materials 201 and 202 are bonded by a thin adhesive without change in temperature, and material 201 has a coefficient of thermal expansion greater than that of material 202. In FIG. 2b, both materials expand with increasing temperature (delta T), but material 201 expands a greater distance than material 202, thus creating a stress at the interface 203 where the two materials are joined. If the stresses exceed the strength of the interfacial adhesion, as in FIG. 2c, delamination occurs at a point indicated as 205, and the stress is relieved. If, on the other hand, the interfacial adhesion strength is stronger than the applied stress, materials 201 and 202 remain joined together at the interface 203, but the material having a lower modulus of elasticity becomes distorted, as shown in FIG. 2d by bowing 208 and sagging 207. In this example, material 201 has both a higher expansion coefficient, and a lower modulus, and thus is the material which becomes distorted. Distortion may be permanent and result in sagging with some materials, or with others, may contract upon cooling to near its original form.

However, if the expansion coefficient of the two materials is equal, their rates of expansion are equal, no stress is exerted at the interface, and neither material is distorted. Equation (1) for stresses on laminated elements are well known, and are directly applicable to this current invention.

$$\sigma = K(\alpha_1 - \alpha_2)\Delta T \sqrt{E_1 E_3 L/X} \qquad \text{Equation (1)}$$

where $\sigma$: stress applied to material 201

K: constant $\alpha_1$: expansion coefficient material 201

$\alpha_2$: expansion coefficient material 202

$\Delta T$: temperature difference $E_1$: elastic modulus 201

E3: elastic modulus 203

L: length

W: adhesive thickness

From the above equation, the stress increases as the temperature, length of materials, difference in expansion coefficients and modulus increases. In the tape carrier/cover of this invention, adhesive thickness is so small that it provides little relief from the increasing stress.

Figure 3:
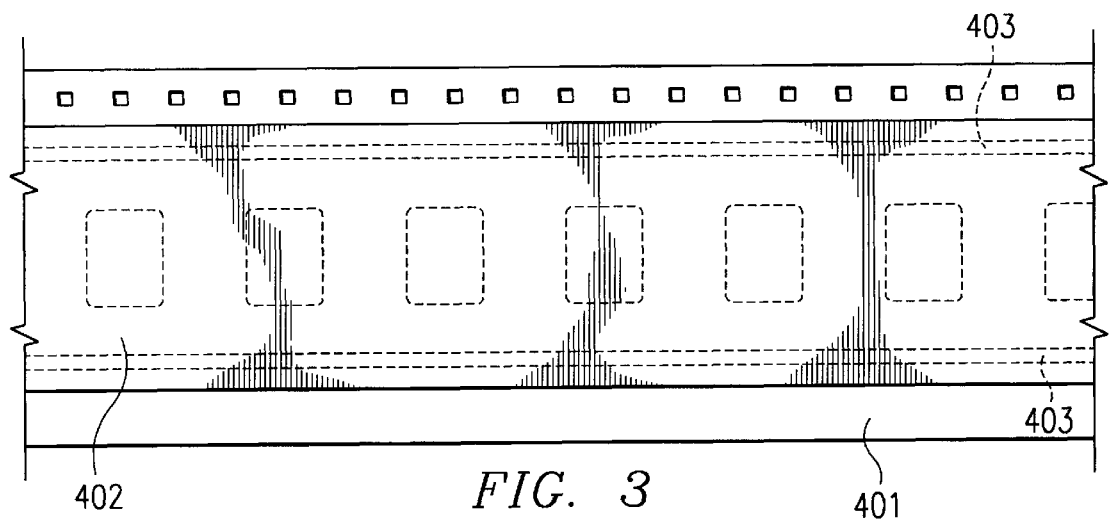
FIG. 3 is a plan view of carrier tape with adhesive and cover tape.

In the tape carrier assemblage of this invention for transporting, storing and baking semiconductor devices, shown in FIG. 3 a relatively long section of carrier tape 401 with recesses for the devices is adhered to an equally long pieces of cover tape 402, by a very thin adhesive 403 positioned near the tape edge. Tape widths are generally in the range of 8 to 56 mm, and the length may be as much as 20 to 30 meters. In order to minimize stress at the interface 403 of such long sections, the materials 401 and 402 are closely matched in thermal properties up to the maximum use temperature of 125 degrees C.

Figure 4A:
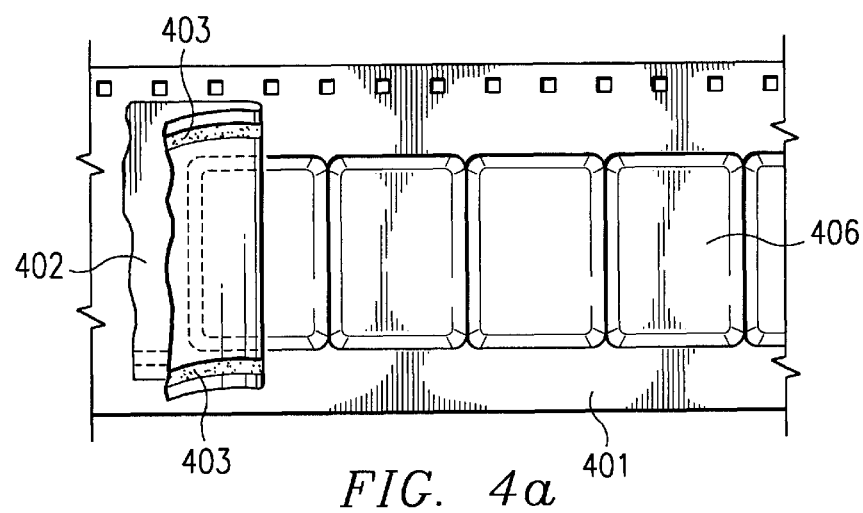
FIG. 4a is a view of the carrier with an array of recesses, and a cover tape.
Figure 4B:
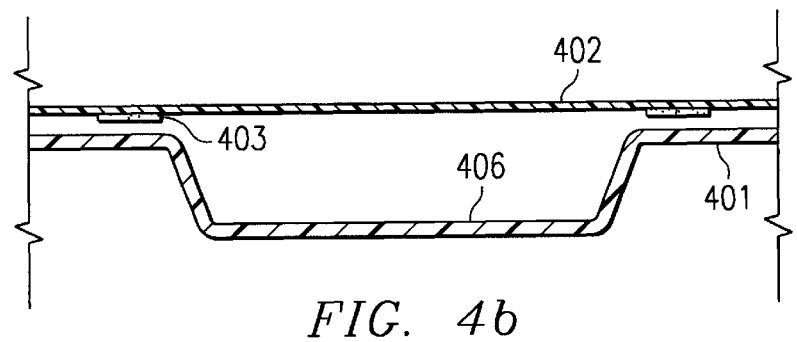
FIG. 4b is a cross section through a carrier recess with an adhered cover tape.

Components of the current invention are illustrated in greater detail in FIGS. 4a and 4b. Both the carrier tape 401, and cover tape 402 are of the same material having similar thermal characteristics, and thereby avoiding stresses caused by thermal mismatch on the thin film of joining adhesive 403, and avoiding distortion and delamination of the thin cover tape 402.

Integrated circuit packages may be automatically vacuum loaded into each cavity in the long carrier tape, the tape indexed to the next position, a cover tape pressure sealed onto the loaded cavity, and the tape indexed onto the reel. For unloading, the procedure may be reversed.

In the preferred embodiment, the material for both the cover tape 402 and carrier tape 401 are polycarbonate polymers. Polycarbonate provides a material having heat deflection temperature of about 140 degrees C is capable of withstanding the maximum dry bake temperature of 125 degrees Centigrade. It has a high impact strength, making it suitable as a thin cover film for protection of the semiconductor devices during transport or handling. Further, polycarbonates are commercially available as high purity, low outgassing polymers as is necessary for the semiconductor application.

Significant advantages of selecting polycarbonate for the carrier and cover system are that it is consistent with the material of carrier tapes currently in use, and thus is available without a need for manufacturing process or tooling change to fabricate the carrier tape and form recesses for the devices. Further, this material selection provides the advantage of being compatible with existing reels and with customer application equipment.

The polycarbonate cover tape 402 is a very thin film, in the range of 0.05 to 0.10 mm thickness. Films of this thickness range are somewhat transparent, thus meeting another desirable property for a cover tape. Further, the thin film is flexible and tolerates being wound onto a transport reel without delamination from the carrier or cracking.

To complete a carrier and cover tape assemblage compatible with high temperature dry baking of IC devices, a commercially available pressure sensitive adhesive is applied to the cover tape in the areas to be mated to the carrier tape, as illustrated in FIGS. 3 and 4. The pressure sensitive adhesive is thermally stable to 125 deg C, and its adhesion remains consistent throughout the length of the tape, thus allowing a steady release process. This type of adhesive allows the cover tape to be released at 130 grams peel force, whereas a thermally sensitive adhesive increases in adhesion force and does not allow the cover to be released on demand. An example of a pressure sensitive cover tape adhesive is from 3M Company, as 3M 2666 cover tape.

Thus, the assemblage of the current invention is dimensionally stable for extended periods of time at 125–130 degrees C. Further, the current invention allows use of existing equipment and processes for both the supplier and user. There is no significant change in weight or volume from existing tape carrier systems and the design is compatible with industry standards.

The thermally matched carrier and cover tape assemblage of this invention are suitable for leaded surface mount packages, such as QFP, PLCC, SOJ, SOIC, as well as more advanced devices such as ball grid array (BGA) or chip scale packages (CSP).

While the invention has been described in connection with a preferred embodiment, it is not intended to limit the scope of the invention to a particular form set forth, but on the contrary, it is intended to cover alternatives, modifications, and equivalents as may be included within the spirit and scope of the invention as defined by the appended claims.

What is claimed is:

1. An assemblage for holding, transporting and baking semiconductor devices including the following;
   a carrier tape having an array of recesses,
   a cover tape comprising the same polymer and having the same thermal properties as said carrier tape,
   an adhesive joining said tape components, and a plurality of integrated circuit devices.

2. An assemblage as in claim 1 wherein said carrier and cover tapes have heat deflection temperature greater than 125 degrees C.

3. An assemblage as in claim 1 said carrier tape and said cover tape comprise polycarbonate resin.

4. An assemblage as in claim 1 wherein said cover tape is in the range of 0.05 to 0.10 mm thickness.

5. An assemblage as in claim 1 wherein said adhesive is a pressure sensitive adhesive.

6. An assemblage as in claim 1 wherein said assemblage is dimensionally stable at 125 degrees C.

7. An assemblage as in claim 1 having thermal characteristics equal to those of a transport reel onto which said assemblage is wound.

8. An assemblage as in claim 1 wherein said semiconductor devices are leaded plastic molded surface devices.

9. An assemblage as in claim 1 wherein said semiconductor devices are ball grid array (BGA) devices.

10. An assemblage as in claim 1 wherein said semiconductor devices are chip scale packages (CSP).

11. A tape assemblage for holding, transporting and baking semiconductor devices including the following;
    a carrier tape having an array of recesses comprising a polycarbonate resin having a heat deflection temperature greater than 125 degrees C,
    a cover tape in the range of 0.05 to 0.10 mm thickness comprising
    a polycarbonate resin having the same thermal properties as said carrier tape,
    an adhesive joining said tape components, and a plurality of integrated circuit devices.

* * * * *